(12) United States Patent
Nishimiya et al.

(10) Patent No.: US 10,928,691 B2
(45) Date of Patent: Feb. 23, 2021

(54) ACTIVE MATRIX SUBSTRATE COMPRISING A FIRST CONTACT HOLE THAT OVERLAPS WITH A COUNTER ELECTRODE CONTROL LINE AND PASSES THROUGH A FLATTENING FILM AND LIQUID CRYSTAL DISPLAY WITH THE SAME

(71) Applicant: Sharp Kabushiki Kaisha, Sakai (JP)

(72) Inventors: Setsuji Nishimiya, Sakai (JP); Tohru Daitoh, Sakai (JP); Hajime Imai, Sakai (JP); Tetsuo Kikuchi, Sakai (JP); Masahiko Suzuki, Sakai (JP); Teruyuki Ueda, Sakai (JP); Masamitsu Yamanaka, Sakai (JP); Kengo Hara, Sakai (JP); Hitoshi Takahata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/788,423

(22) Filed: Feb. 12, 2020

(65) Prior Publication Data

US 2020/0264485 A1     Aug. 20, 2020

Related U.S. Application Data

(60) Provisional application No. 62/805,980, filed on Feb. 15, 2019.

(51) Int. Cl.
*G02F 1/1362* (2006.01)
*G02F 1/1343* (2006.01)
(Continued)

(52) U.S. Cl.
CPC ...... *G02F 1/136227* (2013.01); *G02F 1/1368* (2013.01); *G02F 1/133345* (2013.01);
(Continued)

(58) Field of Classification Search
CPC ..... G02F 2001/136295; G02F 2201/40; G02F 2001/134318
See application file for complete search history.

(56) References Cited

U.S. PATENT DOCUMENTS

2013/0240916 A1* 9/2013 Choi .................. H01L 27/156
257/88
2015/0198845 A1* 7/2015 Lee ................... G02F 1/133602
349/46

(Continued)

FOREIGN PATENT DOCUMENTS

JP       2008008965 A  *  1/2008
JP       2016-126336 A      7/2016
(Continued)

*Primary Examiner* — Paul C Lee
(74) *Attorney, Agent, or Firm* — Keating & Bennett, LLP (57) ABSTRACT

An active matrix substrate 10 includes: switching elements 120 that are connected with gate lines and data lines provided on a substrate; pixel electrodes 130 that are connected with the switching elements 120; counter electrodes 140 that overlap with the pixel electrodes 130 when viewed in a plan view; a flattening film 154; and lines 142. The flattening film 154 covers the switching elements 120, and first contact holes CH1 that pass through the flattening film 154 are formed at positions that overlap with the lines 142 when viewed in a plan view. The pixel electrodes 130 and the counter electrodes 140 are arranged so that each of the same partially covers the flattening film 154. The line 142 and the counter electrode 140 are connected with each other in the first contact hole CH1.

5 Claims, 7 Drawing Sheets (51) Int. Cl.
*G02F 1/1368* (2006.01)
*G02F 1/1333* (2006.01)
(52) U.S. Cl.
CPC .. *G02F 1/134363* (2013.01); *G02F 1/136286* (2013.01); *G02F 2001/136295* (2013.01); *G02F 2201/121* (2013.01); *G02F 2201/40* (2013.01)

(56) References Cited

U.S. PATENT DOCUMENTS

| | | | | |
|---|---|---|---|---|
| 2015/0362811 | A1* | 12/2015 | Huang | G02F 1/134363 438/104 |
| 2016/0062193 | A1* | 3/2016 | Yamayoshi | H01L 27/1288 349/43 |
| 2016/0187690 | A1 | 6/2016 | Nam et al. | |
| 2017/0329176 | A1* | 11/2017 | Kawabuchi | G02F 1/133512 |

FOREIGN PATENT DOCUMENTS

| | | | | | |
|---|---|---|---|---|---|
| KR | 20090090708 | A | * | 8/2009 | G02F 1/134363 |
| KR | 20130020561 | A | * | 2/2013 | G02F 1/13439 |

* cited by examiner

ACTIVE MATRIX SUBSTRATE COMPRISING A FIRST CONTACT HOLE THAT OVERLAPS WITH A COUNTER ELECTRODE CONTROL LINE AND PASSES THROUGH A FLATTENING FILM AND LIQUID CRYSTAL DISPLAY WITH THE SAME

TECHNICAL FIELD

The present invention relates to an active matrix substrate, and a liquid crystal display device including the same.

BACKGROUND ART

JP-A-2016-126336 discloses a display that has an image display function of displaying an image in a display area, and a touch detection function of detecting a position at which a dielectric body such as a user's finger is brought into contact with a display surface. On this display, a plurality of common electrodes for causing horizontal electric fields to be generated between pixel electrodes and the common electrodes when the image display function works are provided on an active matrix substrate. These common electrodes are used also for detecting changes in electrostatic capacitances caused by a contact of a dielectric body when the touch detection function works; therefore, the common electrodes function as touch detecting electrodes. In other words, this display is an in-cell touch display in which elements of the touch detection function are incorporated in the active matrix substrate. Each common electrode is connected with a conductive line. To the conductive line, a common voltage for performing image display is applied when the image display function works, and signals indicating respective electrostatic capacitances in the common electrodes are read out through the conductive lines when the touch detection function works.

On the above-described display, contact lines for connecting the common electrodes and the conductive lines are provided on an outermost surface of the active matrix substrate. On top of the surface of the active matrix substrate, resin such as polyimide is applied so as to form an alignment film for aligning liquid crystal molecules in a predetermined direction, and the active matrix substrate is bonded with a counter substrate provided with color filters. In a case where contact lines are provided on an outermost surface of the active matrix substrate, like the above-described display, portions where the contact lines are provided are raised. In areas (raised areas) where portions are raised by the contact lines on the surface of the active matrix substrate, the alignment film is not uniformly formed, which causes display irregularities. The active matrix substrate, therefore, preferably includes fewer raised areas on the surface thereof.

An active matrix substrate made in light of the above-described problems includes: a substrate; a gate line that is arranged on the substrate; a data line that is arranged so as to intersect with the gate line; a switching element that is connected with the gate line and the data line; a pixel electrode that is connected with the switching element; a counter electrode that is arranged so as to overlap with the pixel electrode when viewed in a plan view; a flattening film that covers the switching element; a counter electrode control line that is connected with the counter electrode; and a first contact hole that overlaps with the counter electrode control line when viewed in a plan view and passes through the flattening film, wherein each of the pixel electrode and the counter electrode are arranged so as to partially cover the flattening film, and the counter electrode control line is provided between the switching element and the flattening film, and is connected with the counter electrode in the first contact hole.

In the display device in which the active matrix substrate having the above-described configuration is used, it is unlikely that display irregularities would occur.

MODE FOR CARRYING OUT THE INVENTION

Embodiment 1

The following description describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of part of constituent members is omitted. Further, dimension ratios of constituent members illustrated in the drawings do not necessarily indicate actual dimension ratios.

Figure 1:
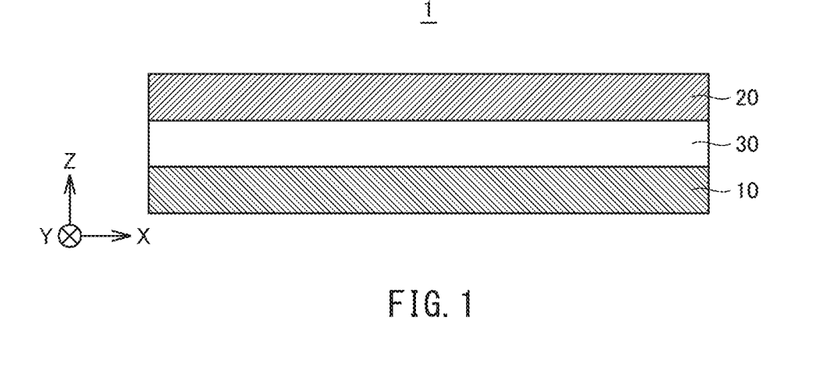
FIG. 1 is a cross-sectional view illustrating a schematic configuration of a display device in Embodiment 1.

FIG. 1 is a cross-sectional view illustrating an display device 1 in the present embodiment. The display device 1 in the present embodiment is a liquid crystal display device that includes an active matrix substrate 10, a counter substrate 20, and a liquid crystal layer 30 interposed between the active matrix substrate 10 and the counter substrate 20. Each of the active matrix substrate 10 and the counter substrate 20 includes a glass substrate that is substantially transparent (having high translucency). In addition, alignment films made of a resin such as polyimide are provided between the active matrix substrate 10 and the liquid crystal layer 30, and between the counter substrate 20 and the liquid crystal layer 30. Further, the display device 1 in FIG. 1 includes a backlight on a surface of the active matrix substrate 10, the surface being on a side opposite to the liquid crystal layer 3 side, so that the backlight extends in the surface direction.

The display device 1 has an image display function of displaying an image, and at the same time, has a touch detection function of detecting a position where a user touches an image displayed thereon (touch position). In other words, the display device 1 is a so-called in-cell touch display in which elements necessary for detecting a touch position are provided on the active matrix substrate 10.

In the display device 1, the liquid crystal molecules included in the liquid crystal layer 30 are driven in the horizontal electric field driving method. To realize the horizontal electric field driving method, the pixel electrodes and the counter electrodes (common electrodes) for forming electric fields are formed on the active matrix substrate 10.

Figure 2:
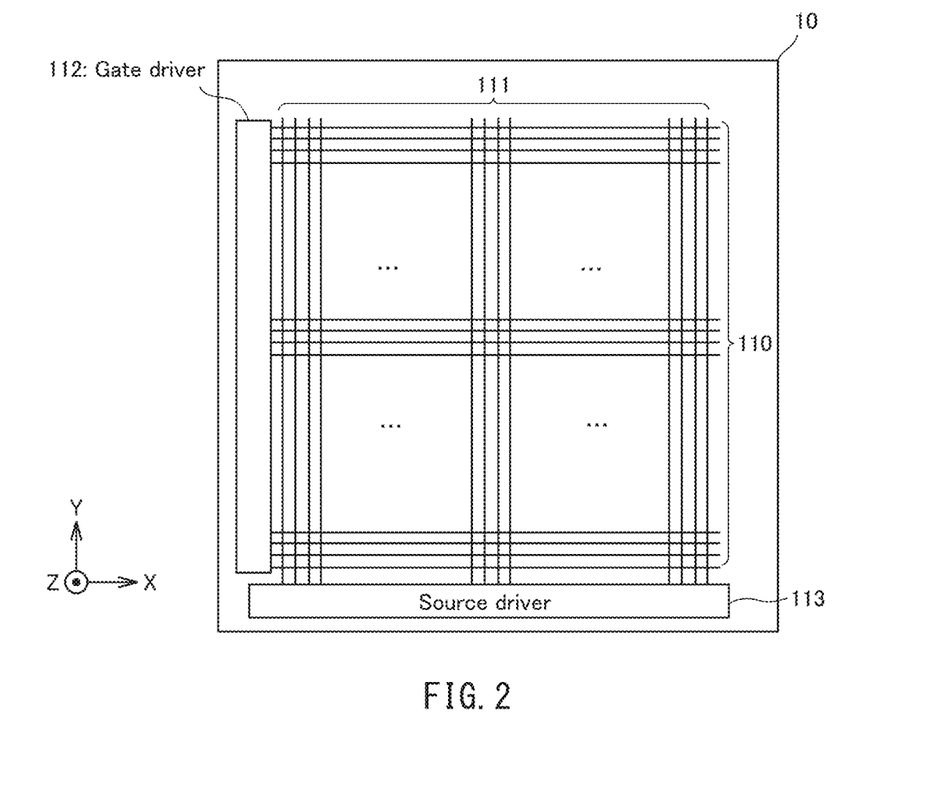
FIG. 2 is a plan view schematically illustrating a schematic configuration of the active matrix substrate illustrated in FIG. 1.

FIG. 2 is a plan view schematically illustrating a schematic configuration of the active matrix substrate 10. As illustrated in FIG. 2, the active matrix substrate 10 includes a plurality of gate lines 110, a plurality of data line 111, a gate driver 113, and a source driver 112.

The active matrix substrate 10 has a display area composed of pixels each of which is defined by the gate lines 110 and the data lines 111.

Each gate line 110 is connected to the gate driver 112, and each data line 111 is connected with the source driver 113.

The gate driver 112 supplies a scanning signal to the gate lines 110 sequentially, the scanning signal being intended to cause the gate line 110 to make a transition to a selected state or a non-selected state. When each gate line 110 becomes selected, the source driver 113 supplies, to the data lines 111, data signals that indicate respective gray level values of images to be written in the pixels corresponding to the foregoing gate line 110.

Figure 3:
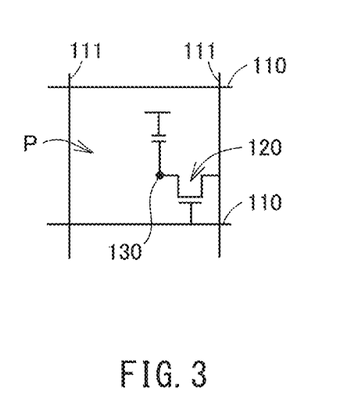
FIG. 3 is an equivalent circuit diagram of a pixel on the active matrix substrate illustrated in FIG. 2.

FIG. 3 is an equivalent circuit diagram of one pixel. As illustrated in FIG. 3, the pixels P include thin film transistors (TFTs) 120 as switching elements at positions at which the gate lines 110 and the data lines 111 intersect, and pixel electrodes 130 connected with the TFTs 120. Gates of the TFTs 120 are connected to the gate lines 110, sources thereof are connected to the data lines 111, and drains thereof are connected with the pixel electrodes 130. Though not illustrated in FIG. 3, the pixel P has a counter electrode for causing a horizontal electric field to be formed between the counter electrode and the pixel electrode 130.

The TFTs 120 are turned ON when the gate line 110 corresponding to the same is selected, and voltage signals applied to the data lines 111 are applied to the pixel electrodes 130 through the sources and the drains of the TFTs 120. This causes the alignment of liquid crystal molecules in the pixel P to change, thereby causing the transmittance of the pixel P to change.

Figure 4:
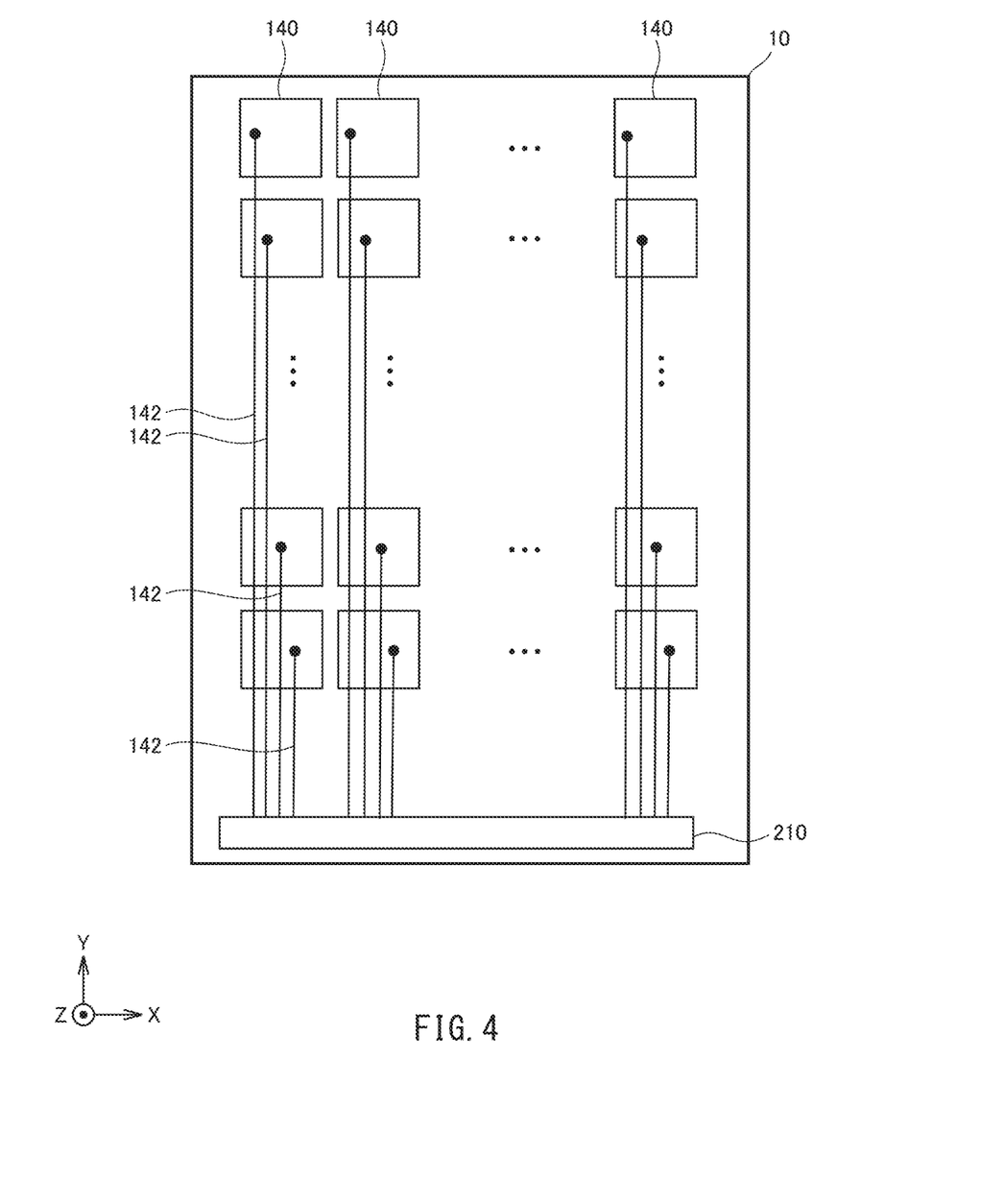
FIG. 4 schematically illustrates an exemplary arrangement of counter electrodes provided on the active matrix substrate illustrated in FIG. 1.

The following description describes an exemplary arrangement of the counter electrodes on the active matrix substrate 10. FIG. 4 is a plan view schematically illustrating an exemplary arrangement of the counter electrodes.

As illustrated in FIG. 4, a plurality of the counter electrodes 140 are arranged in matrix on the active matrix substrate 10. Each counter electrode 140 has, for example, an approximately square shape whose side is about several millimeters. Though the illustration is omitted in this drawing, the counter electrodes 140 have slits (having a width of, for example, several micrometers) for causing horizontal electric fields to be generated between the counter electrodes 140 and the pixel electrodes 130.

On the active matrix substrate 10, a controller 210 is provided. The controller 210 switch a controlling operation for causing the counter electrode 140 to function as common electrodes for performing image display (image display control), and a controlling operation for causing the counter electrodes 140 to function as touch electrodes for detecting a touch (touch detection control) in a time-division manner.

The controller 210 and each common electrode 140 are connected with each other by a counter electrode control line 142 extending in the Y axis direction. In other words, the counter electrode control lines 142, the number of which is the same as that of the counter electrodes 140, are provided on the active matrix substrate 10.

Each counter electrode 140 has a parasitic capacitances between the same and adjacent ones of the counter electrodes 140. When a human finger or the like touches the display screen, capacitances generated between the counter electrodes 140 and the human finger or the like cause electrostatic capacitances of the counter electrodes 140 to increase. In the touch detection control, the controller 210 supplies a voltage signal for touch detection (driving signal) to the counter electrodes 140 through the counter electrode control lines 142, and acquires a voltage signal (detection signal) corresponding to the electrostatic capacitances in the counter electrodes 140 through the counter electrode control lines 142. On the other hand, in the image display control, the controller 210 supplies a predetermined constant voltage to each counter electrode 140 through the counter electrode control lines 142.

Referring back to FIG. 1, the following description describes the counter substrate 20. The counter substrate 20 includes color filters (not illustrated) of three colors of red (R), green (G), and blue (B) on a surface thereof on the liquid crystal layer 30 side. The color filters of the three colors are arrayed so that the pixel electrodes 130 (see FIG. 3) in each of the pixels P correspond to any of the colors of R, G, and B.

Figure 5A:
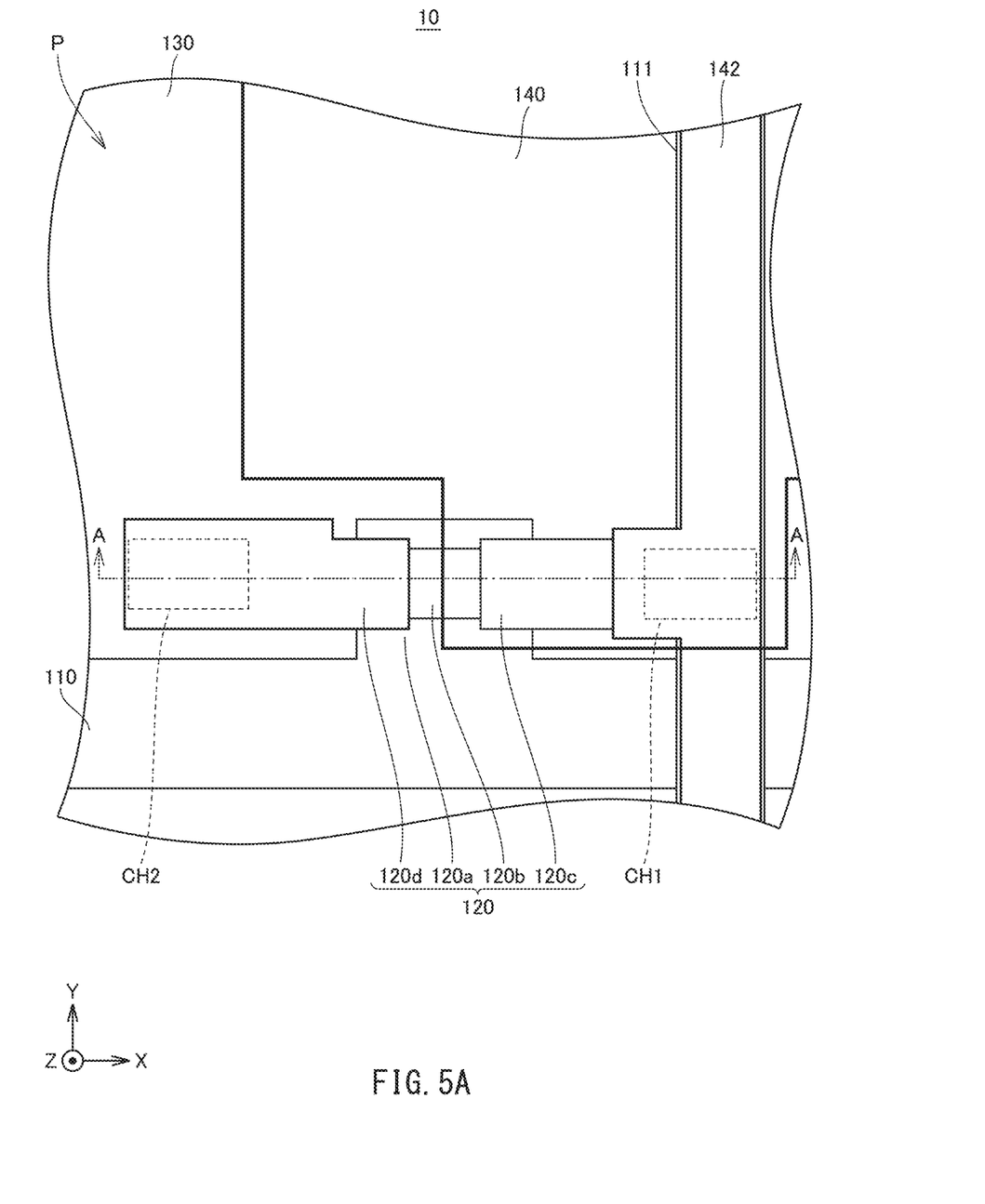
FIG. 5A is an enlarged schematic plan view illustrating a part of an area of the pixel illustrated in FIG. 3.
Figure 5B:
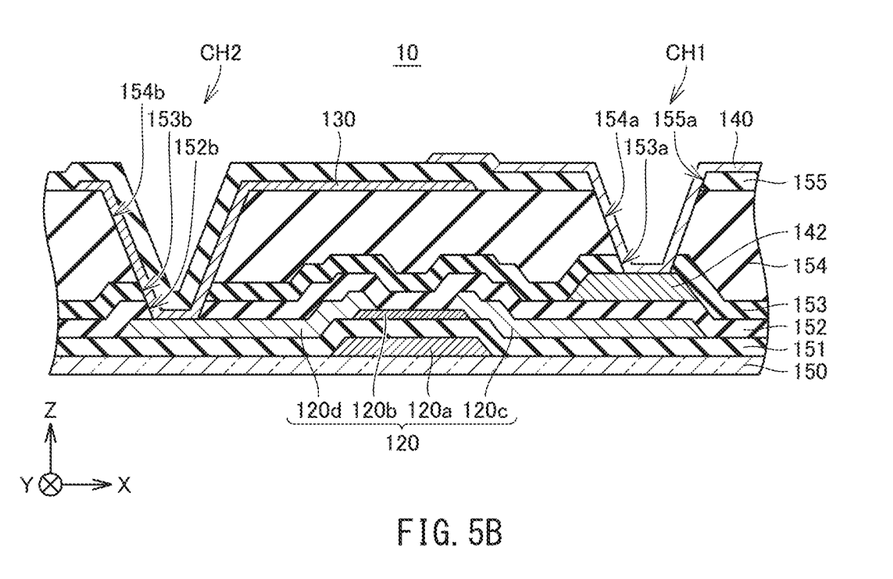
FIG. 5B is a cross-sectional view taken along line A-A in FIG. 5A.

The following description describes a specific configuration of one pixel P on the active matrix substrate 10, while referring to FIGS. 5A and 5B. FIG. 5A is an enlarged plan view illustrating a part of an area of one pixel P, and FIG. 5B is a cross-sectional view taken along line A-A in FIG. 5A.

As illustrated in FIG. 5B, a gate insulating film 151 and the TFT 120 are provided on the glass substrate 150. The TFT 120 includes a gate electrode 120a, a semiconductor film 120b, a source electrode 120c, and a drain electrode 120d.

The gate electrode 120a is formed with a laminate film of titanium (Ti) and copper (Cu) in this example. The configuration of the gate electrode 120a is not limited to the two-layer structure, and may be a single layer structure, or alternatively, a laminate structure of three or more layers. Further, the materials for the gate electrode 120a are not limited to those described above, and the gate electrode 120a may be made of a metal material such as aluminum (Al), molybdenum (Mo), or an alloy containing molybdenum (Mo) or copper (Cu). Incidentally, in this example, the gate line 110 has the same structure as that of the gate electrode 120a, but the gate line 110 and the gate electrode 120a may have different structures.

The gate insulating film 151 covers the gate electrode 120a. In this example, the gate insulating film 151 is made of silicon nitride ($SiN_x$) or silicon dioxide ($SiO_2$).

On the gate insulating film 151, the semiconductor film 120b is arranged. The semiconductor film 120b in this example is formed with an oxide semiconductor containing In—Ga—Zn—O. Incidentally, the semiconductor film 120b may be formed with an oxide semiconductor made of materials other than those described above, or may be formed with an amorphous semiconductor.

Further, on the gate insulating film 151, the source electrode 120c and the drain electrode 120d are arranged so as to be separated on the semiconductor layer 120b. The source electrode 120c and the drain electrode 120d are formed with a laminate film of titanium (Ti) and copper (Cu) in this example. The configuration of the source electrode 120c and the drain electrode 120d is not limited to the two-layer structure, and may be a single layer structure, or alternatively, a laminate structure of three or more layers. Further, the materials for the source electrode 120c and the drain electrode 120d are not limited to those described above, and the source electrode 120c and the drain electrode 120d may be made of a metal material such as aluminum (Al), molybdenum (Mo), or an alloy containing either molybdenum (Mo) or copper (Cu).

As illustrated in FIG. 5A, in the present embodiment, the data line 111 is formed integrally with the source electrode 120c, approximately in parallel with the Y-axis direction in FIG. 5A. In this example, the data line 111 has the same structure as that of the source electrode 120c and the drain electrode 120d, but the data line 111 may have a structure different from that of the source electrode 120c and the drain electrode 120d.

As illustrated in FIG. 5B, an inorganic insulating film 152 is arranged so as to cover the gate insulating film 151, the semiconductor film 120b, the source electrode 120c, and the drain electrode 120d. In the layer where the inorganic insulating film 152 is formed, an opening 152b that passes through the inorganic insulating film 152 is formed at a position that overlaps with the drain electrode 120d when viewed in a plan view. The inorganic insulating film 152 has a laminate structure obtained by laminating silicon nitride ($SiN_x$) and silicon dioxide ($SiO_2$) in this example, but it may have, for example, a single layer structure made of silicon nitride ($SiN_x$).

On the inorganic insulating film 152, at a position that overlaps with the source electrode 120c and the data line 111 when viewed in a plan view, the counter electrode control line 142 is provided. In other words, as illustrated in FIG. 5A, the counter electrode control line 142 extends in the Y-axis direction so as to overlap with the data line 111 when viewed in a plan view. The counter electrode control line 142 is formed with a laminate film of titanium (Ti) and copper (Cu) in this example. The configuration of the counter electrode control line 142 is not limited to the two-layer structure, and may be a single layer structure, or alternatively, a laminate structure of three or more layers. Further, the counter electrode control line 142 may be made of, for example, a metal material such as aluminum (Al), molybdenum (Mo), or an alloy containing either molybdenum (Mo) or copper (Cu).

Still further, an inorganic insulating film 153 is provided on the inorganic insulating film 152, and in the layer where the inorganic insulating film 153 is provided, openings 153a and 153b that pass through the inorganic insulating film 153 are formed at a position that overlaps with the counter electrode control line 142 when viewed in a plan view, and at a position that overlaps with the opening 152d when viewed in a plan view. The inorganic insulating film 153 has a laminate structure obtained by laminating silicon nitride ($SiN_x$) and silicon dioxide ($SiO_2$) in this example, but it may have, for example, a single layer structure made of silicon nitride ($SiN_x$).

Still further, an organic insulating film (flattening film) 154 is provided on the inorganic insulating film 153, and in the layer where the organic insulating film 154 is provided, openings 154a and 154b that pass through the inorganic insulating film 154 are formed at a position that overlaps with the opening 153a when viewed in a plan view, and at a position that overlaps with the opening 153b when viewed in a plan view. In other words, the openings 152b, 153b, and 154b overlap with one another when viewed in a plan view, and a contact hole CH2 is formed with these openings. The organic insulating film 154, in this example, is made of a photosensitive resin, an acrylic organic resin material such as methyl polymethacrylate resin (PMMA), or the like.

On the organic insulating film 154, at a position that overlaps with the counter electrode control line 142 when viewed in a plan view, the pixel electrode 130 is provided. The pixel electrode 130 is connected with the drain electrode 120d in the contact hole CH2. The pixel electrode 130 is made of indium tin oxide (ITO) in this example, but the material for forming the pixel electrode 130 is not limited to this. The pixel electrode 130 may be made of, for example, a transparent conductive material such as zinc oxide (ZnO), indium zinc oxide (IZO), indium gallium zinc oxide (IGZO), or indium tin zinc oxide (ITZO).

Still further, an inorganic insulating film 155 is provided on the organic insulating film 154 so as to cover the pixel electrode 130, and in the layer where the inorganic insulating film 155 is provided, an opening 155a that passes through the inorganic insulating film 155 is formed at a position that overlaps with the opening 154a when viewed in a plan view. In other words, the openings 153a, 154a, and 155a overlap with one another when viewed in a plan view, and a contact hole CH1 is formed with these openings. In this example, the inorganic insulating film 155 is made of silicon nitride ($SiN_x$), but the material for the inorganic insulating film 155 is not limited to this.

On the inorganic insulating film 155, a counter electrode 140 is provided. The counter electrode 140 is connected with the counter electrode control line 142 in the contact hole CH1. The counter electrode 140 is arranged so as to overlap with a part of the pixel electrode 130 when viewed in a plan view, with the inorganic insulating film 155 being interposed therebetween. The counter electrode 140 is made of indium tin oxide (ITO) in this example, but the material of the counter electrode 140 is not limited to this. The counter electrode 140 may be made of, for example, a transparent conductive material such as zinc oxide (ZnO), indium zinc oxide (IZO), indium gallium zinc oxide (IGZO), or indium tin zinc oxide (ITZO).

The active matrix substrate 10 illustrated in FIGS. 5A and 5B can be produced by the following method.

First, the gate insulating film 151 and the TFT 120 are formed by a known method on the glass substrate 150 illustrated in FIG. 5B. In this example, the gate line 110 is formed at the same time when the gate electrode 120a of the TFT 120 is formed, and the data line 111 is formed at the same time when the source electrode 120c and the drain electrode 120d are formed.

Thereafter, for example, silicon nitride ($SiN_x$) and silicon dioxide ($SiO_2$) that will form the inorganic insulating film 152 are deposited in this order by chemical vapor deposition (CVD) so as to cover the source electrode 120c and the drain electrode 120d.

Subsequently, for example, copper (Cu) and titanium (Ti) that will form the counter electrode control line 142 are deposited by sputtering in this order on the inorganic insulating film 152. Then, photolithography and wet etching are carried out so that the laminate film of copper (Cu) and titanium (Ti) is patterned. Through these steps, the counter electrode control line 142 is formed at a position that overlaps with the source electrode 120c when viewed in a plan view.

Thereafter, for example, silicon nitride ($SiN_x$) and silicon dioxide ($SiO_2$) that will form the inorganic insulating film 153 are deposited in this order on the inorganic insulating film 152 by CVD so as to cover the counter electrode control line 142.

Next, for example, a photosensitive resin that will form the organic insulating film 154 is applied over the inorganic insulating film 153 by slit coating, and then, exposing and developing are performed so that the photosensitive resin is removed at a position that overlaps with the counter electrode control line 142 when viewed in a plan view, and a position that overlaps with the drain electrode 120d when viewed in a plan view. Through these steps, the organic insulating film 154 and the openings 154a, 154b are formed.

Subsequently, using the organic insulating film 154 as a mask, the inorganic insulating films 152 and 153 are subjected to dry etching. Through this step, the opening 153a of the inorganic insulating film 153 is formed at a position that overlaps with the opening 154a when viewed in a plan view, and the opening 152b of the inorganic insulating film 152 as well as the opening 153b of the inorganic insulating film 153 are formed at a position that overlaps with the opening 154b when viewed in a plan view. As a result, the contact hole CH2 that passes through the inorganic insulating films 152, 153 and the organic insulating film 154 is formed.

Thereafter, for example, a film of ITO that will form the pixel electrode 130 is formed by sputtering on the organic insulating film 154, and photolithography and wet etching are carried out so that the ITO film is patterned. Through these steps, the pixel electrode 130 that is provided on the organic insulating film 154 and is connected with the drain electrode 120d in the contact hole CH2 is formed.

Subsequently, for example, a film of silicon nitride ($SiN_x$) as the inorganic insulating film 155 is formed by CVD so as to cover the organic insulating film 154 and the pixel electrode 130. Then, photolithography and dry etching are carried out so as to pattern the inorganic insulating film 155. Through these steps, an opening 155a of the inorganic insulating film 155 is formed at a position that overlaps with the openings 153a and 154a when viewed in a plan view, whereby the contact hole CH1 composed of the openings 153a, 154a, and 155a is formed.

Next, for example, a film of ITO that will form the counter electrode 140 is formed by sputtering on the inorganic insulating film 155, and photolithography and wet etching are carried out so that the ITO film is patterned. Through these steps, on the inorganic insulating film 155, the counter electrode 140 that is connected with the counter electrode control line 142 in the contact hole CH1 is formed, whereby the active matrix substrate 10 is produced.

Thereafter, the active matrix substrate 10 is bonded with the counter substrate 20, and the liquid crystal layer 30 is sealed into between the active matrix substrate 10 and the counter substrate 20. Before the active matrix substrate 10 is bonded with the counter substrate 20, a resin film made of polyimide or the like is applied over the surface on the Z-axis positive direction side of the active matrix substrate 10 so as to form an alignment film (not illustrated) for aligning liquid crystal molecules in a predetermined direction.

In the present embodiment, as illustrated in FIG. 5B, the counter electrode control line 142 is provided in a lower layer (in the Z-axis negative direction side) with respect to the layer of the organic insulating film 154, and the surfaces of the inorganic insulating film 155 and the counter electrode 140, which are provided on the organic insulating film 154, compose the outermost surface of the active matrix substrate 10. If the counter electrode control line 142 was provided in an upper layer with respect to the organic insulating film 154 and was connected with the counter electrode 140, the portion where the counter electrode control line 142 was provided would be raised on the surface of the active matrix substrate 10. In a case where the active matrix substrate is used as a liquid crystal display panel, a film of a resin such as polyimide is applied over a surface of the active matrix substrate so as to form an alignment film. In so doing, on the raised areas on the surface of the active matrix substrate, it is unlikely that the resin film would be uniformly formed, which would cause display irregularities. As described above, in the present embodiment, the counter electrode control line 142 is provided in a lower layer with respect to the layer of the organic insulating film 154, and the surface of the counter electrode control line 142 is not exposed. Therefore, as compared with a case where the counter electrode control line 142 is provided in an upper layer with respect to the organic insulating film 154, it is unlikely that a raised portion would be formed on the surface of the active matrix substrate 10, which allows the alignment film to be formed uniformly. As a result, it is unlikely that display irregularities would occur resulting from an alignment film that is not uniformly formed.

Embodiment 2

Embodiment 1 above is described with reference to an exemplary case where the counter electrode control line 142 has a two-layer structure obtained by laminating titanium (Ti) and copper (Cu), but the counter electrode control line 142 may have the following configuration.

The counter electrode control line 142 may have, for example, a structure that is obtained by further laminating a metal film made of aluminum (Al) on a laminate film obtained by laminating titanium (Ti) and copper (Cu). In this case, the laminate is formed in such a manner that metal films of titanium (Ti), copper (Cu), and aluminum (Al) are arranged in this order from the counter electrode 140 side. In place of titanium (Ti), titanium nitride (TiN) may be used.

As aluminum (Al) is contained in the counter electrode control line 142, the treatment by wet etching, which is performed when the counter electrode control line 142 is formed, can be performed more easily, as compared with Embodiment 1.

Embodiment 3

In Embodiment 1 described above, the counter electrode 140 is arranged in the uppermost layer of the active matrix substrate 10, and the pixel electrode 130 is arranged in a lower layer with respect to the counter electrode 140; however, the arrangement of the pixel electrode 130 and the counter electrode 140 is not limited to this.

Figure 6:
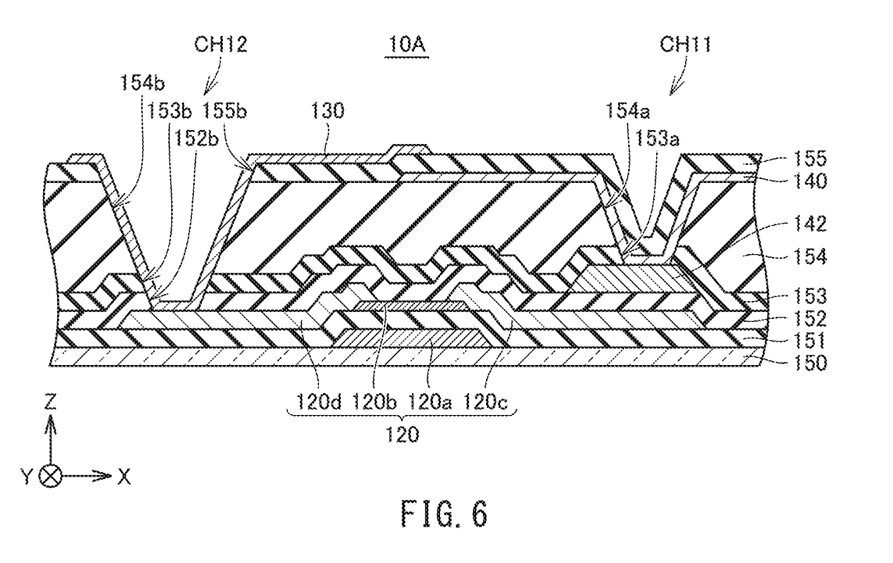
FIG. 6 is a cross-sectional view illustrating a pixel on an active matrix substrate in Embodiment 3.

FIG. 6 is a cross-sectional view illustrating a pixel on an active matrix substrate in the present embodiment. In FIG. 6, the same constituent members as those in Embodiment 1 are denoted by the same reference symbols as those in Embodiment 1. The following description principally describes constituent members different from those in Embodiment 1.

As illustrated in FIG. 6, in the active matrix substrate 10A in the present embodiment, the counter electrode 140 is arranged on the organic insulating film 154, and the pixel electrode 130 is arranged on the inorganic insulating film 155.

On the inorganic insulating film 153 and the organic insulating film 154, at a position that overlaps with the counter electrode control line 142 when viewed in a plan view, the openings 153a, 154a are formed, and a contact hole CH11 is formed with these openings 153a, 154a. The counter electrode control line 142 is connected with the counter electrode 140 in the contact hole CH11.

In the inorganic insulating film 152, the inorganic insulating film 153, the organic insulating film 154, and the inorganic insulating film 155, openings 152b, 153b, 154b, and 155b are formed at a position that overlaps with the drain electrode 120d when viewed in a plan view. A contact hole CH12 is formed with these openings 152b, 153b, 154b, and 155b. The pixel electrode 130 is connected with the drain electrode 120d in the contact hole CH12.

In this case as well, the counter electrode control line 142 is provided in a lower layer with respect to the organic insulating film 154, as is the case with Embodiment 1. Therefore, as compared with a case where the counter electrode control line 142 is provided in an upper layer with respect to the organic insulating film 154, there are less raised portions on the outermost surface of the active matrix substrate 10A, and it is likely that an alignment film would be uniformly formed on the surface of the active matrix substrate 10A.

Incidentally, the counter electrode control line 142 in the present embodiment, as is the case with Embodiment 2, may be formed with a laminate film obtained by laminating titanium (Ti) or titanium nitride (TiN), copper (Cu), and aluminum (Al) in this order from the counter electrode 140 side.

Embodiment 4

Embodiment 1 above is described with reference to an exemplary case where the counter electrode control line 142 is arranged so as to overlap with the data line 111 when viewed in a plan view, but the arrangement of the counter electrode control line is not limited to this; the arrangement may be as follows.

Figure 7A:
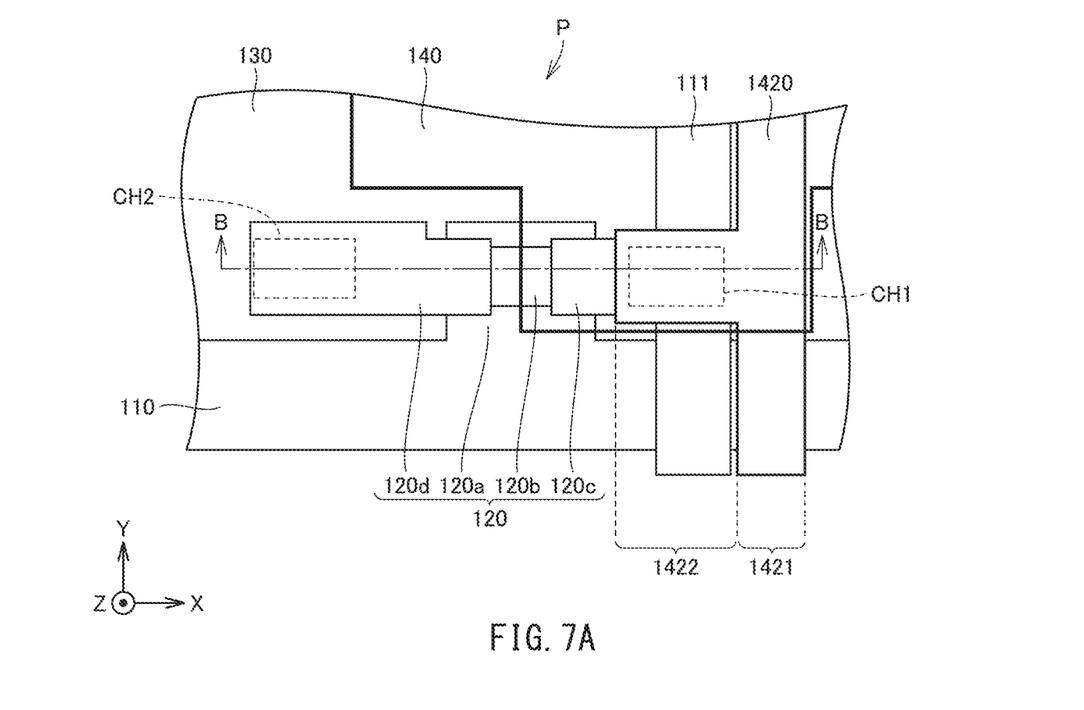
FIG. 7A is an enlarged schematic plan view illustrating a part of an area of a pixel on an active matrix substrate in Embodiment 4.
Figure 7B:
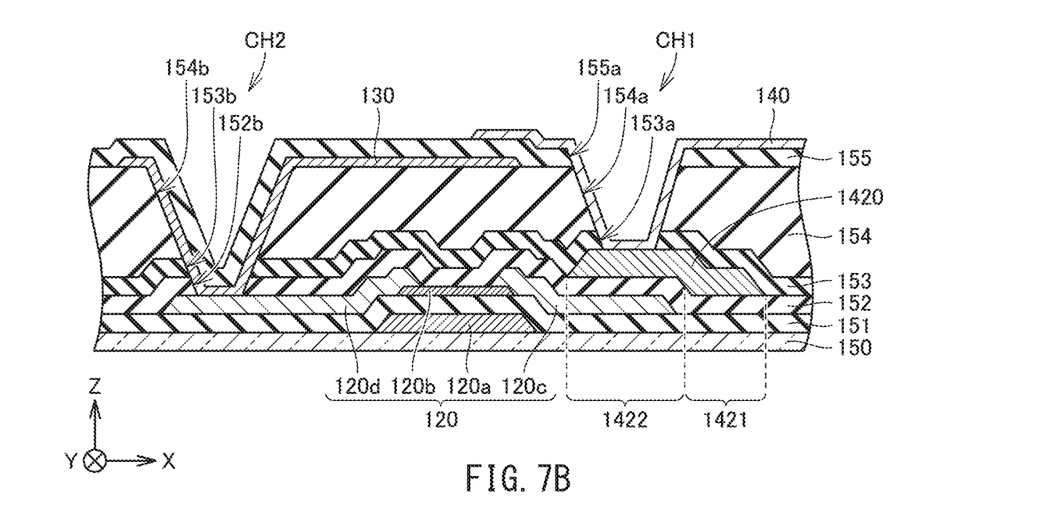
FIG. 7B is a cross-sectional view taken along line B-B in FIG. 7A.

FIG. 7A is a plan view illustrating a part of an area of a pixel on an active matrix substrate in the present embodiment, and FIG. 7B is a cross-sectional view taken along line B-B shown in FIG. 7A. In FIGS. 7A and 7B, the same constituent members as those in Embodiment 1 are denoted by the same reference symbols as those in Embodiment 1.

As illustrated in FIGS. 7A and 7B, in the present embodiment, a counter electrode control line 1420 is provided in place of the counter electrode control line 142. The counter electrode control line 1420 includes a line portion 1421 that is approximately parallel with the data line 111 (hereinafter referred to as a first line part), and a portion 1422 that projects out in the data line 111 direction from the first line part 1421 (hereinafter referred to as a second line part). The first line part 1421 does not overlap with the data line 111 when viewed in a plan view, and the second line part 1422 overlaps with the data line 111 when viewed in a plan view. A contact hole CH1 is arranged at a position that overlaps with the second line part 1422 when viewed in a plan view, and the second line part 1422 and the counter electrode 140 are connected with each other in the contact hole CH1.

Figure 8:
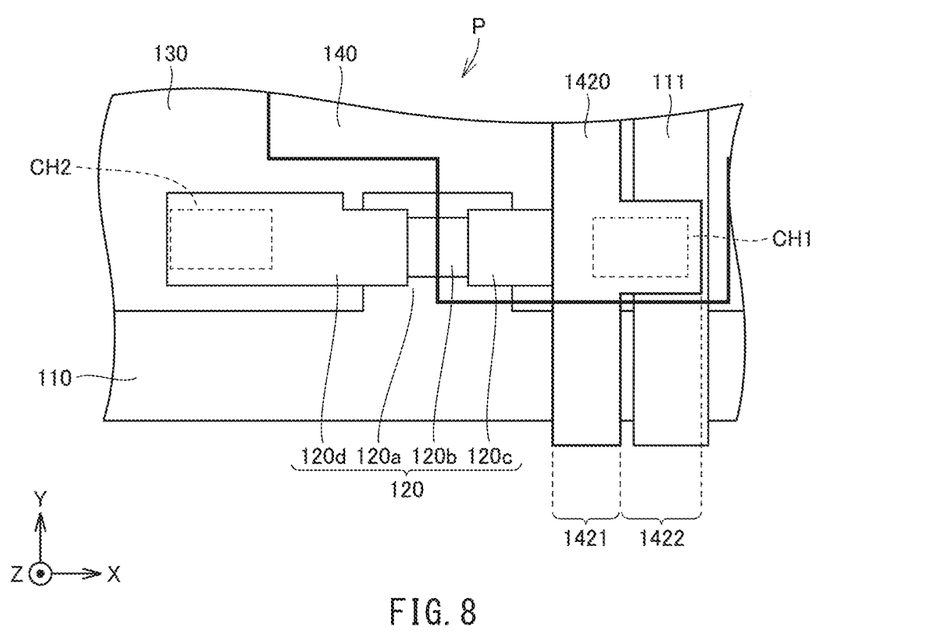
FIG. 8 is an enlarged plan view illustrating a part of an area of a pixel, which is a schematic plan view illustrating an example that is different in the arrangement of counter electrode control lines from that in FIG. 7A.

Incidentally, in FIGS. 7A and 7B, the counter electrode control line 1420 is arranged in such a manner that the first line part 1421 is arranged on a side opposite to the side of the source electrode 120c of the TFT 120 with respect to the data line 111, but the arrangement of the counter electrode control line 1420 is not limited to this. For example, as illustrated in FIG. 8, the counter electrode control line 1420 may be arranged in such a manner that the first line part 1421 is arranged on the side of the source electrode 120c of the TFT 120 with respect to the data line 111, and the second line part 1422 overlaps with the data line 111 when viewed in a plan view.

Further, in the example described above, the counter electrode control line 1420 includes the second line part 1422, and the counter electrode control line 1420 is arranged in such a manner that the second line part 1422 is arranged so as to overlap with the data line 111 when viewed in a plan view, but the configuration of the counter electrode control line is not limited to this. For example, the counter electrode control line formed with the first line part 1421 alone may be arranged at a position that does not overlap with the data line 111 when viewed in a plan view. In this case, the contact hole CH1 is formed so that the first line part 1421 is connected with the counter electrode 140.

As compared with the above-described configurations, the aperture ratio of the pixel can be increased in this configuration where the data line 111 and the counter electrode control line are arranged so as to overlap with each other when viewed in a plan view. However, even in the above-described configuration, as is the case with Embodiment 1, there are fewer raised portions on the outermost surface of the active matrix substrate 10, which makes it easier to form an alignment film uniformly on the surface of the active matrix substrate 10.

The foregoing description describes the embodiments of the present invention, but the present invention is not limited to the configurations of the above-described embodiments; the configuration can be varied in many ways.

(1) The above-described embodiments are described with reference to an exemplary configuration in which the inorganic insulating films 152, 153 are provided in an upper layer with respect to the TFT 120, but the configuration may be such that only the inorganic insulating film 152 is provided. It should be noted that in a case of this configuration, moisture easily gets in from the organic insulating film 154, as compared with a case where the inorganic insulating film 153 is provided, and this makes it likely that the line 1420 could be corroded, thereby having line disconnection or the like. Therefore, it is preferable that the inorganic insulating film 153 is provided on the line 1420.

The above-described active matrix substrate and the above-described liquid crystal display panel including the same can be described as follows.

An active matrix substrate includes: a substrate; a gate line that is arranged on the substrate; a data line that is arranged so as to intersect with the gate line; a switching element that is connected with the gate line and the data line; a pixel electrode that is connected with the switching element; a counter electrode that is arranged so as to overlap with the pixel electrode when viewed in a plan view; a flattening film that covers the switching element; a counter electrode control line that is connected with the counter electrode; and a first contact hole that overlaps with the counter electrode control line when viewed in a plan view and passes through the flattening film, wherein the pixel electrode and the counter electrode are arranged so that each of the same partially covers the flattening film, and the counter electrode control line is provided between the switching element and the flattening film, and is connected with the counter electrode in the first contact hole (the first configuration).

According to the first configuration, the active matrix substrate includes, on the substrate, the gate line, the data line, the switching element, the pixel electrode, the counter electrode, the flattening film, the line, and the first contact hole. The switching element connected to the gate line and the data line are covered with the flattening film, and the counter electrode control line is provided between the switching element and the flattening film. The pixel electrode and the counter electrode partially cover the flattening film, and the pixel electrode and the counter electrode are arranged so as to overlap with each other when viewed in a plan view. The pixel electrode is connected with the switching element. The first contact hole passes through the flattening film, and the line and the counter electrode are connected with each other in the first contact hole CH1.

In other words, the surface of the counter electrode control line is not exposed, since the counter electrode control line is arranged on the substrate side with respect to the flattening film. Therefore, it is unlikely that a raised portion would be formed on an outermost surface of the active matrix substrate, as compared with a case where the counter electrode control line is arranged so that the surface thereof forms the outermost surface of the active matrix substrate. As a result, in a case where the active matrix substrate is used in a liquid crystal display panel, it is likely that an alignment film can be formed uniformly on the outermost surface of the active matrix substrate, thereby making it unlikely that display irregularities would occur.

The first configuration may be further characterized in that the counter electrode control line is arranged so as to overlap with the data line when viewed in a plan view (the second configuration).

With the second configuration, the aperture ratio of the pixel where the pixel electrode is provided can be increased, as compared with a case where the counter electrode control line does not overlap with the data line when viewed in a plan view.

The first or second configuration may be further characterized in further including: a first inorganic insulating film that is arranged between the switching element and the counter electrode control line; and a second contact hole that overlaps with the pixel electrode when viewed in a plan view, and passes through the first inorganic insulating film and the flattening film, wherein the pixel electrode and the switching element are connected with each other in the second contact hole (the third configuration).

According to the third configuration, the switching element is covered with the first inorganic insulating film and the flattening film, which makes it possible to protect the switching element from moisture and the like.

The third configuration may be further characterized in further including: a second inorganic insulating film that covers the surfaces of the counter electrode control line and the first inorganic insulating film, wherein the first contact hole passes through the flattening film and the second inorganic insulating film, and the second contact hole passes through the flattening film, the second inorganic insulating film, and the first inorganic insulating film (the fourth configuration).

According to the fourth configuration, the switching element is covered with the first inorganic insulating film and the second inorganic insulating film, which makes it possible to protect the switching element from moisture and the like better, as compared with a case where the second inorganic insulating film is not provided.

Any one of the first to fourth configurations may be further characterized in that the counter electrode is formed with a transparent conductive film; the counter electrode control line is formed with a laminate of a plurality of metal films; and the metal films include a metal film made of aluminum (the fifth configuration).

According to the fifth configuration, a metal film made of aluminum is included in the counter electrode control line, which makes it easier to, for example, perform patterning by wet etching that is performed when the counter electrode control line is formed.

The fifth configuration may be further characterized in further including a third inorganic insulating film that is arranged on the flattening film, wherein the first contact hole passes through the flattening film, the second inorganic insulating film, and the third inorganic insulating film at a position that overlaps with the counter electrode control line when viewed in a plan view; the pixel electrode is arranged between the flattening film and the third inorganic insulating film; and the counter electrode is arranged on the third inorganic insulating film (the sixth configuration).

According to the sixth configuration, the flattening film is covered with the third inorganic insulating film, which makes it unlikely that moisture would get into the active matrix substrate, thereby making the active matrix substrate more reliable as compared with a case where the third inorganic insulating film is not provided. Besides, as the counter electrode is arranged on the third inorganic insulating film, the surface of the counter electrode is exposed, but the surface of the counter electrode control line is not exposed, since the counter electrode control line is arranged on the substrate side with respect to the flattening film. Therefore, it is unlikely that a raised portion would be formed on an outermost surface of the active matrix substrate, and even in a case where an alignment film is formed on the outermost surface of the active matrix substrate, it is likely that the alignment film would be formed uniformly, thereby making it unlikely that display irregularities would occur.

A liquid crystal display panel includes: the active matrix substrate according to any one of the first to sixth configurations; a counter substrate arranged so as to face the active matrix substrate; a liquid crystal layer interposed between the active matrix substrate and the counter substrate; a first alignment film formed on a surface on a liquid crystal layer side of the active matrix substrate; and a second alignment film formed on a surface on a liquid crystal layer side of the counter substrate (the seventh configuration).

According to the seventh configuration, in the active matrix substrate, the counter electrode control line is arranged on the substrate side with respect to the flattening film, whereby the surface of the counter electrode control line is not exposed. Therefore, as compared with a case where the configuration is such that the surface of the counter electrode control line is the outermost surface of the active matrix substrate, it is unlikely that a raised portion would be formed on an outermost surface of the active matrix substrate, and this makes it likely that the first alignment film would be uniformly formed. This makes it unlikely that display irregularities would occur.

DESCRIPTION OF REFERENCE NUMERALS

1: display device
10, 10A: active matrix substrate

20: counter substrate
30: liquid crystal layer
110: gate line
111: data line
112: gate driver
113: source driver
120: TFT (switching element)
130: pixel electrode
140: counter electrode
142, 1420: counter electrode control line
210: controller
154: organic insulating film (flattening film)
1421: first line part
1422: second line part

What is claimed is:

1. An active matrix substrate comprising:
a substrate;
a gate line that is arranged on the substrate;
a data line arranged so as to intersect with the gate line;
a switching element that is connected with the gate line and the data line;
a pixel electrode that is connected with the switching element;
a counter electrode that is arranged so as to overlap with the pixel electrode when viewed in a plan view;
a fattening film that covers the switching element;
a counter electrode control line that is connected with the counter electrode;
a first contact hole that overlaps with the counter electrode control line when viewed in the plan view and passes through the flattening film,
a first inorganic insulating film that is arranged between the switching element and the counter electrode control line;
a second contact hole that overlaps with the pixel electrode when viewed in the plan view, and passes through the first inorganic insulating film and the flattening film; and
a second inorganic insulating film that covers surfaces of the counter electrode control line and the first inorganic insulating film, wherein
the pixel electrode and the counter electrode are arranged so that each of the same partially covers the flattening film,
the counter electrode control line is provided between the switching element and the flattening film, and is connected with the counter electrode in the first contact hole,
the pixel electrode and the switching element are connected with each other in the second contact hole,
the first contact hole passes through the flattening film and the second inorganic insulating film, and
the second contact hole passes through the flattening film, the second inorganic insulating film, and the first inorganic insulating film.

2. The active matrix substrate according to claim 1, wherein the counter electrode control line is arranged so as to overlap with the data line when viewed in the plan view.

3. The active matrix substrate according to claim 1, wherein the counter electrode is formed with a transparent conductive film,
the counter electrode control line is formed with a laminate of a plurality of metal films, and
the metal films include a metal film made of aluminum.

4. The active matrix substrate according to claim 1, further comprising:
a third inorganic insulating film that is arranged on the flattening film,
wherein the first contact hole passes through the flattening film, the second inorganic insulating film, and the third inorganic insulating film at a position that overlaps with the counter electrode control line when viewed in the plan view,
the pixel electrode is arranged between the flattening film and the third inorganic insulating film, and
the counter electrode is arranged on the third inorganic insulating film.

5. A liquid crystal display device comprising:
the active matrix substrate according to claim 1;
a counter substrate arranged so as to face the active matrix substrate;
a liquid crystal layer interposed between the active matrix substrate and the counter substrate;
a first alignment film formed on a surface on a liquid crystal layer side of the active matrix substrate; and
a second alignment film formed on a surface on a liquid crystal layer side of the counter substrate.

* * * * *